United States Patent [19]

Kameoka et al.

[11] Patent Number: 5,733,668
[45] Date of Patent: Mar. 31, 1998

[54] METHOD FOR THE PREPARATION OF WC-CO ALLOYS AND HARD CARBON-LAYER COATED ON WC-CO ALLOYS, AND THEIR COATED TOOLS

[75] Inventors: Seiji Kameoka; Tsutomu Ikeda; Toshiki Sato, all of Akashi, Japan

[73] Assignee: Kabushiki Kaisha Kobe Seiko Sho, Kobe, Japan

[21] Appl. No.: 584,301

[22] Filed: Jan. 11, 1996

[51] Int. Cl.$^6$ ............................... B32B 19/00; B05D 1/08
[52] U.S. Cl. ...................... 428/698; 428/408; 428/569; 428/697; 427/446
[58] Field of Search ....................... 428/697, 698, 428/408, 336, 546, 569; 427/451, 446

[56] References Cited

U.S. PATENT DOCUMENTS

| | | | |
|---|---|---|---|
| 5,316,859 | 5/1994 | Harada et al. | 428/697 X |
| 5,328,761 | 7/1994 | Omori et al. | 428/336 |
| 5,391,422 | 2/1995 | Omori et al. | 428/212 |
| 5,415,674 | 5/1995 | Feistritzer et al. | 51/293 |
| 5,491,028 | 2/1996 | Sarin et al. | 428/698 X |
| 5,567,526 | 10/1996 | Peters et al. | 428/698 X |

OTHER PUBLICATIONS

JP 63053269-A Abst.
J 85005673-B Abst.
J 88020911-B Abst.
JP04 263074-A Abst.
JP04263075-A Abst.
JP05195223-A Abst.
JP01246361-A Abst.
JP62067174-A Abst.
JP04231428-A Abst.
J03219079-A Abst.

*Primary Examiner*—Daniel Zirker
*Attorney, Agent, or Firm*—Oblon, Spivak, McClelland, Maier & Neustadt, P.C.

[57] ABSTRACT

The present invention discloses a WC—Co alloy in which substantially only the WC particles of a surface layer or components other than metals belonging to the iron group and only the WC particles are exposed, and (a) an average particle diameter of the WC particles of the surface layer is larger than that of the WC particles of the interior, and/or (b) a surface hardness is higher than that of the interior. The WC—Co alloy itself is Used as a stock for a cutting tool or an abrasion and sliding resistant tool, or the alloy is used as a substrate and a hard carbon-layer excellent in adhesive strength is coated on the surface of the matrix.

18 Claims, No Drawings

METHOD FOR THE PREPARATION OF WC-CO ALLOYS AND HARD CARBON-LAYER COATED ON WC-CO ALLOYS, AND THEIR COATED TOOLS

BACKGROUND OF THE INVENTION

1. Field of the Invention

The present invention relates to WC—Co alloys having WC as a main component, hard carbon-layer coated on WC—Co alloys having a hard carbon-layer such as diamond or amorphous carbon coated on the surface of the WC—Co alloys, method for the preparation of the WC—Co alloys, And their coated tools suitable for cutting tools and abrasion and sliding-resistant tools.

2. Description of the Related Art

Super hard alloys which sintered with carbide powder of high melting-point metal have been generally used as stocks of cutting tools for cutting of difficult-to-work materials or the like. Particularly, super hard WC—Co system alloys in which Co powder as a binder metal is added to WC powder and sintered, have been widely used as stocks for not only cutting tools but also draw dies and other abrasion and sliding-resistant tools. Further, super hard alloys such as WC—TiC—Co system, WC—TaC—Co system, WC—TiC—TaC—Co system or the like to which carbide such as TiC or TaC having higher hardness than that of WC is added at high temperatures, have been also used from a viewpoint of improving the wear-resistant properties of WC—Co system alloys.

Mechanical properties of WC—Co alloys greatly change of depending upon the particle diameters of WC, kinds and quantities of carbide contained, quantities of the binding phase and the like. For example, materials for the cutting tools are classified into a P series (WC—TiC—TaC—Co system), a K series (WC—Co system), and an M series (intermediate properties between the P series and K series). It is known that WC—Co alloys using superfine particles of 0.5 μm or less in diameter reveal excellent toughness.

The WC—Co alloys in the present invention will suffice to have WC as a main component and include any of the above-described WC—Co alloys. The binding phase includes one using a metal belonging to the iron group (for example, Ni) other than the Co. The following description will be made centering around the WC—Co system.

It is general in WC—Co alloys that as the WC content increases (that is, the Co content decreases), the wear resistant properties are improved while the toughness lowers. Accordingly, it is the actual circumstances that the composition of WC—Co alloys used is selected in consideration of the cutting conditions and work-materials to be cut, when WC—Co based alloys are applying to the tools.

As described above, in the mechanical properties of the WC—Co alloys, both the hardness or wear resistance and toughness are properties contrary to one another. In the prior art, it is only the way that ceramics of high hardness such as TiN, TiC or the like are coated on the surface of the WC—Co alloy in order to improve the wear resistance without impairing the toughness. It has been difficult to attain both properties at a high level using the WC—Co alloy alone.

On the other hand, hard carbon such as diamond, amorphous carbon, etc. has extremely high hardness as well as high heat conductivity, compared with alumina, silicon nitride, tungsten carbide, etc. which have been generally used as hard materials. Therefore, application and development of the hard carbon are now under way as stocks for cutting tools, abrasion and sliding-resistant tools, etc. Recently, particularly in the field of cutting process, there is a rapid increase in tendency toward higher hardness and cutting-retardant of materials to be cut. Conventional cutting tools cannot respond to such a tendency. Thus, the development of high-performance cutting tools provided with both high hardness and high toughness has been eagerly desired. Under these circumstances, there has been actively developed tools made of a hard carbon-layer coated on WC—Co alloy which is prepared such that a superfine particle system WC—Co alloy having excellent toughness is used as a matrix for tool, and a hard carbon layer is coated on the surface of the matrix by a vapor phase synthetic method.

However, in the case where the WC—Co alloy is used as the matrix for tool, the binding phase contains Co (or other elements in iron group) in the amount of about 3 to 20%. Carbon is dissolved into Co during deposition, then, a hard carbon layer can not be formed on the substrate surface. Even if the hard carbon layer is partly formed, adhesion properties between the surface layer and substrate is not sufficient so that the layer easily peels off. Under these circumstances, tools made of a hard carbon-layer coated on WC—Co alloy so far developed have no special characteristics as expected.

In order to overcome such inconveniences as noted above, techniques are proposed as disclosed, for example, in Japanese Patent Publication No. 20911/1988, Japanese Patent Laid-Open Publication No. 53269/1988, and so on. These techniques comprise subjecting the surface of WC—Co alloy to etching treatment using nitric acid or hydrochloric acid and thereby dissolving and removing Co on the surface layer. However, sufficient effects cannot be obtained even by these techniques. That is, in these techniques, Co which is a bonding phase of the matrix for WC—Co alloy is eluted by acid, posing a drawback that the strength of the surface layer of the matrix considerably lowers. Further, Japanese Patent Laid-Open Publication No. 219079/1991 Publication and Laid-Open Publication No. 231428/1992 propose techniques such that as the preceding step in which the surface of WC—Co alloy is subjected to chemical etching, the matrix is secondarily sintered or heat-treated in a non-oxidation atmosphere, or a Co short layer is extinguished by vacuum heat treatment after diamond is coated. Even these techniques fail to completely overcome the lowering of strength of the matrix by dissolving and removing the bonding phase of the surface.

On the other hand, Japanese Patent Laid-Open Publication No. 67174/1987 also discloses the technique in which the bonding phase of the surface of WC—Co alloy is removed by the treatment of hydrochloric acid prior to coating the hard carbon layer on the surface of WC—Co alloy from a view point similar to the above. This technique provides that the depth of a bonding metal phase to be removed is [more than 1/100 but less than 2/3 of an average particle size of a hard dispersed phase of the surface of WC—Co alloy]. However, in this technique, since a removing area of the bonding phase is shallow, the strength of the surface layer of the matrix less lowers but an improvement in adhesive strength relative to the hard carbon layer as originally intended is not attained. That is, in this technique, the bonding phase of the surface layer cannot be completely removed since the removing area of the bonding phase is shallow but the bonding phase is partly exposed. Accordingly, the hard carbon layer does not assume a state that it is coated only on the hard dispersed phase in the interface between the matrix and the hard carbon layer, but a portion to be coated is left on the bonding metal phase though partly. Therefore, the adhesive strength between the hard carbon layer and substrate surface is not sufficient.

Further, Japanese Patent Laid-Open Publication No. 263074/1992 and Japanese Patent Laid-Open Publication No. 263075/1992 propose the following techniques. The gist of these techniques is intended to increase an contact area between diamond layer and substrate surface and improve an adhesive force resulting from the anchor effect by forming fine unevenness on the matrix surface. For example, there is disclosed a technique that the matrix surface of WC—Co is subjected to mirror-surface processing, the fine unevenness is formed on the surface by laser processing and after this, the diamond layer is coated. Further, Japanese Patent Publication No. 5673/1985 proposes a technique that WC particles on the matrix surface are made larger than that of within the matrix, from a viewpoint similar to the above, in order to improve the peeling resistance.

In these techniques, however, a geometrical state of the matrix is merely changed, or WC-powders of different grain size are mixed and sintered (gaps between WC particles are bonded by Co diffused out of the interior). Since the chemical cause exerted by the bonding phase which comprises the main cause of poor adhesion between substrate and diamond layer as previously mentioned is not at all solved, it is difficult to obtain a sufficient effect, for increasing the adhesive strength of diamond layer.

Further, from a viewpoint of the fact that the fine unevenness is formed on the surface to thereby improve the adhesive strength of the diamond layer, Japanese Patent Laid-Open Publication No. 246361/1989 and Laid-Open Publication No. 195223/1993 propose the technique that WC—Co alloy is heat-treated to thereby form the unevenness on the surface. The former Publication suggests the presence of the effect that the bonding phase is removed to some extent from a viewpoint of a description "the reason why such a heat-treated surface is preferable is . . . reduce the influence of the bonding phase on the coated layer . . . " thereof. However, this effect is not satisfactory.

The present invention has been achieved in order to solve the above-described technical problems encountered in the conventional WC—Co alloys or hard carbon-layer coated on WC—Co alloys.

A primary object of the present invention is to provide WC—Co alloys which improve hardness and wear resistance without impairing toughness, are provided with both the hardness and wear resistance and toughness at a high level, and have optimum mechanical properties as stocks for cutting tools and abrasion and sliding resistant tools, and high-performance tools for which such WC—Co alloys are applied.

A further object of the present invention is to provide a useful method for the preparation of WC—Co alloys as described above.

A still another object of the present invention is to provide hard carbon-layer coated on WC—Co alloys in which a hard carbon layer excellent in adhesive properties is coated on a surface of WC—Co alloy and which have optimum mechanical properties as stocks for the above-described various tools, and high-performance tools for which such hard carbon-layer coated on WC—Co alloys are applied.

SUMMARY OF THE INVENTION

The super hard alloy according to the present invention is a WC—Co alloy having WC as a main component and is featurized in that in the surface layer, substantially only the WC particles, or only the components other than metal belonging to the iron group and WC particles are exposed, and (a) the average particle diameter of the WC particles on the surface layer is larger than that of the WC particle on the interior and/or (b) the surface hardness is larger than the hardness of the interior. The WC—Co alloy as described above is constituted as at least the cutting edges of the tools to obtain a high-performance WC—Co alloy tool as desired.

The super hard alloy as described above can be prepared by modifying the surface with the employment of constitutions such that the surface of normal WC—Co alloy is exposed in plasma at least containing H but not containing C, and after that, a material containing C is introduced into a plasma producing system and excited, the surface of the WC—Co alloy is exposed in the plasma or the surface of the WC—Co alloy is further exposed in the plasma containing C, and after that, the introduction of the material containing C into the plasma producing system is stopped, and the surface of the WC—Co alloy is continuously exposed in the plasma substantially not containing C.

Further, a hard carbon layer is coated on the modified surface of WC—Co alloy as described above using a vapor phase deposition method. It is then possible to obtain a hard carbon-layer coated on WC—Co alloy which is not only excellent in adhesive properties between the hard carbon layer and a surface of WC—Co alloy but also sufficiently high in strength of the surface layer. When the aforesaid alloy is constituted at least as cutting edges of the tools which is applied to a cutting tool or the like, it is possible to realize the cutting tool which has a high performance and is longer in life, compared with those of conventional tools.

The present inventors have considered, from all angles, the construction of the WC—Co alloy which can achieve the improvement in hardness and wear resistance without impairing the toughness of the WC—Co alloy. As a consequence, the present inventors have acquired knowledge that the wear resistance of the WC—Co alloy is determined mainly by the configuration in the vicinity of the utmost surface, and that conversely, the toughness of the WC—Co alloy is governed by the configuration of an area which is deeper than the neighborhood of the utmost surface despite the configuration of the utmost surface of the alloy. The present invention further considered on the basis of the aforesaid knowledge and then found that the WC—Co having the aforesaid construction is extremely effective to complete the present invention. That is, in the case of the WC—Co alloy as described above, even the WC—Co alloy comprised of fine particle WC for the purpose of improving the toughness, the WC particles of the surface layer are large, and/or the surface hardness is higher than the interior to enable the provision of excellent strength of the surface layer. Further, such a WC—Co alloy as described is optimum as a stock of high-performance tools.

The present inventors further found that the WC—Co alloy is used as a substrate, and when the hard carbon layer is coated on the surface of the WC—Co alloy by applying a vapor phase deposition method, even in the case of the WC—Co alloy comprised of superfine WC particles for the purpose of improving the toughness of the matrix, the WC particles of the surface layer are large, and/or the surface hardness is high, and Co and other iron group elements which bring forth the lowering of the adhesive properties are removed from the surface layer, thus securing the excellent adhesive strength between the hard carbon layer and the substrate without producing inconveniences such as the lowering of the strength of the surface layer of the WC—Co alloy. Such a hard carbon-layer coated on WC—Co alloy as described is optimum as a stock for high-performance tools.

According to one of features of the WC—Co alloy of the present invention, the average particle diameter of the WC particles of the surface layer is larger than that of the interior. However, the average particle diameter of the WC of the surface layer is preferably more than 0.5 µm in consideration of mechanical properties (particularly, surface strength) as the tool stock. Also in the case where the WC—Co alloy is used as the matrix for the hard carbon layer coated on WC—Co alloy, the average particle diameter of the WC of the surface layer of the matrix is preferably at least more than 0.5 µm from a viewpoint that the interface construction excellent in adhesive properties between the hard carbon layer and the matrix is attained. When the average particle diameter of the WC particles is smaller than that, fine voids tend to remain between the hard carbon layer and the surface of the matrix, failing to secure the excellent adhesive properties. However, the WC—Co alloy according to the present invention will suffice to have the construction that the average particle diameter of the WC particles is larger than that of the WC particles of the interior. The average diameter of the WC particles of the interior may be more than 0.5 µm.

According to another feature of the WC—Co alloy of the present invention, the surface hardness is higher than that of the interior. The micro Vickers hardness (Hv) in the surface of the WC—Co alloy is preferably more than 1650 from a viewpoint that the effect of the wear resistance is further enhanced. Further, in the case where the hard carbon film is coated on the WC—Co alloy according to the present invention, it is preferable that the micro Vickers hardness (Hv) in the hard carbon layer is 4000 to 9000 and the average particle diameter in the surface of the hard carbon layer is less than 5 µm. The peeling cause of the hard carbon layer such as diamond is generally based on the viewpoint that the layer stress on the basis of the difference in thermal expansion coefficient between the layer and the matrix, particularly in case of the diamond layer, the compressive stress is large and the toughness is small. It is possible to obtain a tool provided with both the adhesive strength and wear resistance of the layer at a high level by coating the hard carbon layer as described.

The effects exhibited by the present invention include not only the wear resistance other than the peeling resistance but also the excellent performance of the cutting accuracy. To this end, particularly preferably, at least the average particle diameter of hard carbon layer coated on the cutting edges of the tool and the layer coated in the vicinity thereof have less than 1.0 µm and 6000 to 8000 of the micro Vickers hardness (Hv) of the layer.

As the particle diameter of the coated layer decreases, the number of particles constituting the layer increases, the layer stress is relieved, and the toughness also increases. The relief of the layer stress and the increase of the toughness are considered due to the buffer action of the grain boundary present between the particles. Further, in this case, the excellent effect is exhibited also in the cutting accuracy, which corresponds to the fact that the unevenness of the layer surface become small due to the decrease in the particle diameter present on the utmost surface of the coated layer.

What is important in providing the quality of the hard carbon layer as described above is that there is no correlation between the micro Vickers hardness (Hv) of the layer and the average particle diameter in the surface. That is, even if the average particle diameter is determined, the hardness of the layer is not determined unconditionally thereby. Conversely, the average particle diameter of the layer surface is not determined by the hardness of the layer. The effects of the present invention can be particularly exhibited only in the case where both the elements as described are used as indices, the carbon layer of special constitution in which the values of both the above elements are in the range as described above is used for coating.

The particles constituting the carbon layer according to the present invention are particles that can be confirmed by a usual scanning electron microscope, a transmission electron microscope, and an analyzing method by a device such as X-ray diffraction or electron beam diffraction, and the crystal of hard carbon films thereof has a diamond structure. However, the carbon layer according to the present invention is not necessary to be constituted substantially merely by the particles but is sometimes constituted by a nondiamond component, that is, a mixture of noncrystalline hard carbon and graphite or a fine amount of other metallic components which do not substantially comprise a constituent material.

In the case where the carbon layer is constituted by the mixture of the particles having the diamond structure and the nondiamond component as described above, the ratio of Raman peak intensity ($I_1/I_2$) between the peak intensity ($I_1$) belonging to the diamond and the peak intensity ($I_2$) belonging to the nondiamond component which appears in the specific wave-number region can be provided as an index by the Raman analysis of the carbon layer in order to effectively obtain the object of the present invention. That is, the carbon layer is coated so that in the Raman spectra of at least carbon layer coated on the cutting edges of tools and the carbon layer coated in the vicinity thereof, the ratio of peak intensity ($I_1/I_2$) between the peak intensity ($I_1$) belonging to the diamond and the peak intensity ($I_2$) belonging to the non-diamond component which appears in Raman shift 1450 to 1600 $cm^{-1}$ is 0.5 to 2, whereby the effects of the present invention, the peeling resistance, the wear resistance and the excellent cutting accuracy, can be further enhanced. The intensity ratio ($I_1/I_2$) between the diamond and the nondiamond component in the Raman spectra can be estimated in the following manner. That is, the background is subtracted from the spectra in which the Raman wave number shift is from 900 $cm^{-1}$ to 1800 $cm^{-1}$, and the ratio ($I_1/I_2$) therebetween is obtained from the intensity ($I_1$) of peak corresponding to diamond and the intensity ($I_2$) of peak corresponding to the nondiamond component which appears from 1450 $cm^{-1}$ to 1600 $cm^{-1}$. In this case, the background is determined by connecting the scattering intensity at around 900 $cm^{-1}$ and that at around 1800 $cm^{-1}$ by a straight line. Lasers as an generating source used include Ar laser (wave lengths of 4579 Å (Angstrom), 4727 Å, 4880 Å, 5017 Å, etc.), and Kr laser (wave lengths 4762 Å, 5208 Å, 5682 Å, 6765 Å, etc.).

In the present invention, the quality of the coated layer is provided to thereby obtain particularly excellent effect. However, in the case where the diamond layer of high purity is coated on the WC—Co alloy of the present invention, or also in the case where the amorphous hard carbon or i-carbon is coated thereon, the effect of high adhesive properties is sufficiently exhibited. Accordingly, in the present invention, the coated WC—Co alloy tool having such a constitution as described is not excluded. As will be apparent from the above-mentioned constitution, in the carbon layer coated cutting tool of the present invention, the carbon layer which is satisfied with the above-described requirements is coated at least on the cutting-edges of tools and in the vicinity thereof. The "cutting edges of tools and in the vicinity thereof" herein termed indicates not only the portion in which the tool is in direct contact with the material to be cut during cutting but also the portion with which cuttings discharged by cutting possibly come in contact. The thickness of the carbon layer coated on such portions as just mentioned is not particularly limited but practically, it is preferably 3 to 30 µm thick, more preferably, 5 to 20 µm thick.

The micro Vickers hardness (Hv) of the WC—Co alloy and the coating layer can be estimated in the following manner. That is, in the case where the micro Vickers hardness (Hv) of the coating layer is provided, the test surface need to have a planeness capable of disregarding the curvature. For example, JIS Standards Z 2251 (Method of testing a fine hardness) provides that the test surface should be a plane as a rule, and the finish of the test surface should be smooth to such an extent that the length of a diagonal line of a depression can be easily measured to either large value out of 0.4% or 0.2 µm of the measured value. The above JIS Standards also refers to the thickness of samples, according to which the thickness of a sample should be 1.5 d (d is the length of a diagonal line) as a rule. However, generally, the surface of a tool has a complicated shape. It is sometimes difficult to obtain a planeness capable of obtaining a reliable numerical value. Further, in the present invention, the thickness of the coated layer is not definitely provided. As the case may be, the effect of the present invention can be fully exhibited even if there is no thickness enough to obtain a fully reliable numerical value in accordance with the above JIS Standards.

According to the present invention, in the case where the hardness cannot be measured directly as described above, in the WC—Co alloy, a base plate of the same stock as the tool having a sufficient planeness processed under the same conditions is used as a sample, and in the case where the hard carbon layer is coated, a base plate of the same stock as the tool having a sufficient planeness formed with a layer having substantially the same quality is used as a sample. The micro Vickers hardness (Hv) is then measured whereby it can be provided as the hardness of the matrix of the tool or the coated layer. The same quality of layer termed herein means that the Raman spectra measured under the same conditions have substantially the same pattern, and that the surface morphologies by way of scanning electron microscope observed under the same conditions are substantially the same. In the case of the coated layer, the sample for measuring the hardness is not always necessary to coat and prepare under the same conditions simultaneously with the coating-processing to the tool but can be prepared under the separate conditions if the same quality of layer as that of the above is assured to be provided. Preferably, the sample has the thickness as provided in the aforementioned JIS Standards. Normally, the sample having the thickness of more than 5 µm is used. Further, in the present invention, including the embodiments described later, the normal conditions of the measurement of hardness are that the load is 500 g, and the load holding time is 15 seconds to 20 seconds.

The WC—Co alloy according to the present invention is obtained by simultaneously proceeding the removal of Co (or other iron group elements) as the bonding phase, the grain growth of the WC particles and the sintering of the WC particles through application of adequate treatment to the surface of normal WC—Co alloy. As specific means for that purpose, means for exposing the surface of the WC—Co alloy to the plasma is effective. That is, the bonding phase (Co and other iron group elements) of the WC—Co alloy for the portion constituted at least as a cutting edges of tool or only the cutting edges of tool is effectively removed by applying the aforesaid treatment, and the grain growth of WC particles (or components other than iron group elements and WC particles) and sintering can be simultaneously proceeded. In this case, it is indispensable for effectively proceed these reactions to expose the surface of the WC—Co to the fully excited plasma. As disclosed in the aforementioned Japanese Patent Laid-Open Publication Nos. 219079/1991, 231428/1992, 246361/1989 or 195223/1993, it is not possible to modify the surface of the WC—Co alloy into the state quickly and as desired as in the present invention and as the case may be, the change in internal configuration of the matrix for the WC—Co alloy is brought forth, merely by the heat treatment of the WC—Co alloy under the vacuum atmosphere or under the inactive atmosphere, sometime breaking the sound configuration of the WC—Co alloy to adversely affect thereon.

In the case where the tool made of the WC—Co alloy is directly modified, that is, in the case where the WC—Co alloy according to the present invention is not constituted by brazing-joining or the like but it is modified in a state of the tool as received, the plasma exposure processing shown in the present invention has the merit that only a limited portion required for modification of the surface can be modified, compared with various prior arts as described above. For example, if the present invention is applied to a drill, the drill is arranged in the plasma producing system so that only the edge of tool required is exposed to the plasma producing portion. Then, the surface of only the area of the limited portion of the edge can be modified, but according to the prior art, it is difficult to modify the surface of only the limited area.

A temperature of the surface of the WC—Co alloy when the latter is exposed to the excited plasma is preferably 1000° C. or above in consideration of the efficient removal of the bonding phase and the efficient sintering of the WC particles. An upper limit of the aforesaid temperature is preferably 1400° C. or below from a viewpoint that a η phase, i.e. $M_6C$ (M=W and Co) is not formed. The effective plasma is one in which a material containing at least one kind of element out of H, N, F, C and rare gas is formed into plasma. That is, the plasma containing these elements is excellent in removing the bonding phase, effective in efficiently promoting the sintering of WC particles, and in addition, excellent in cleaning effect of the surface of WC particles. Further, in this case, when C is contained, it is effective to suppress the formation of the η phase, that is, to suppress surplus decarburizing reaction of WC particles under the reducing atmosphere such as H plasma alone.

In the case where the surface of the WC—Co alloy is exposed to the plasma, the content of C in the plasma and the exposure time in the plasma need to be taken into consideration in the following point. That is, when the content of C in the plasma and the exposure time for processing in the plasma are excessively large and long, the surplus C sometimes remains on the surface as a nonstoichiometric tungsten carbide compound such as $WC_{1+x}$ or remains as graphite. When a hard carbon layer is coated on their surface later, the abnormal growth of the hard carbon is sometimes brought forth with the surplus C component being a start point. Further, with respect to the timing of introducing C into the plasma as disclosed, for example, in U.S. Pat. No. 5,415,674, Japanese Patent Laid-Open Publication No. 322543/1994, and so on, when C is introduced from the beginning of the exposure processing, the sintering of WC and growth of particles do not occur normally, sometimes impeding the removal of Co on the surface depending upon the conditions.

Accordingly, in the present invention, in the case where C is introduced to obtain the effect thereof, it is preferred that the content of C and the introducing time are at minimum. As specific means, the surface of the WC—Co alloy is fully exposed to the plasma at least containing H but not containing C, and thereafter, a material containing C is introduced into the plasma producing system to excite it, whereby the WC—Co alloy is exposed in the plasma. Further, preferably, after the surface of the WC—Co alloy is exposed in the plasma into which C is introduced, the introduction of the material containing C into the plasma producing system is stopped. The surface of the WC—Co alloy is continuously exposed in the plasma substantially not containing C to remove the surplus C from the surface of the WC—Co alloy. From a viewpoint of this, preferable ranges of the content of C and the introducing time are that when methane gas is used as a material containing C, the content of C relative to the total quantity of gas is less than 1 volume %, and the introducing time is within 15 min. Accordingly, it is necessary that the processing time for the exposure processing of the surface of the WC—Co alloy in the plasma is within 30 min on the maximum. The exposure processing can be satisfactorily attained in the aforesaid processing time. On the other hand, in the method disclosed in the aforementioned U.S. Pat. No. 5,415,674, there is described that 0.5 to 6 hours for the exposure processing time is necessary. However, the exposure at a high temperature for a long period of time is not preferable because a thermal deterioration results. While means for exciting a plasma is not particularly limited, there can be mentioned RF, micro wave, ECR, DC arc, hot filaments or pulse discharge.

The vapor phase deposition method in which the WC—Co alloy is used as a substrate and the hard carbon layer is coated on the surface of the substrate is not also particularly limited. Known CVD and PVD methods, for example, such as hot filament method, microwave plasma CVD method, radio frequency plasma CVD method, and ion beam method can be applied. Further, raw gases used for synthesis include hydrocarbon gases such as methane and ethane, alcohol gases such as methanol and ethanol or carbon oxide gases such as carbon monoxide, and in addition, a mixed gas of these carbon-containing gases and hydrogen.

In the carbon layer coated tools according to the present invention, tools are not particularly limited but the tools can be applied to the inserts, end-mills, drills, etc. The tool performance can be materially enhanced as compared to conventional cutting tools by employing the aforementioned construction.

The present invention will be further described in detail by way of embodiments. The below-described embodiments are not of nature limiting the present invention but any of changes in design is included in the technical scope of the present invention in the light of the gists described previously and thereafter.

DESCRIPTION OF THE PREFERRED EMBODIMENTS

Embodiment 1

As a matrix for WC—Co alloy, a miniature drill (a diameter: 1 mm) of WC—13% Co (an average particle diameter of WC: approximately 0.4 μm) was used. The drill was processed for 5 min in a hydrogen plasma in which hydrogen gas was excited by microwaves so that a surface temperature is 1250° C. Then, 0.2 volume % of methane gas was added to the hydrogen gas to provide a hydrogen/carbon mixed plasma, and the drill was further processed for 15 min. According to the SEM observation and EPMA analysis of the drill after processing, it was assured that Co on the surface of the drill was completely removed and the average particle diameter of WC of the surface layer was grown to approximately 1.0 μm.

The thus processed drill was dipped into an ethanol suspension in which diamond powders (an average particle diameter: approximately 0.3 μm) are dispersed and subjected to supersonic processing. The drill was then subjected to vapor phase deposition for 5 hours with a methane/hydrogen mixed gas excited by a microwave plasma CVD method, and a hard carbon layer was coated in thickness of approximately 6 μm on the surface of the drill. The synthesizing conditions were that a surface temperature of drill was 800° C., and a methane concentration was 2.0 volume %.

The obtained coating layer was subjected to Raman analysis and X-ray diffraction analysis. As a result, the layer was a hard layer comprised of a mixture of diamond and amorphous carbon, and having of micro Vickers hardness (Hv) of 7000 to 7800. Thus obtained hard carbon layer coated on WC—Co alloy drill will be hereinafter referred to as Example 1 of the present invention.

As the pre-processing for synthesizing a hard carbon film, there were prepared a drill applied with exactly the same processing as that of the above except that processing was conducted for 2 hours under the hydrogen atmosphere at 1250° C. (the gas flow condition of hydrogen pressure 250 Torr) in place of the above-described processing, a drill applied with exactly the same processing as that of the above except that processing is conducted for 1 hour under the vacuum atmosphere of $10^{-3}$ Torr at 1250° C., and a drill applied with exactly the same processing as that of the above except that processing was held for 20 min so that the surface temperature is 1250° C. in a hydrogen/oxygen mixed plasma (a mixed gas in which 0.6 volume % of oxygen gas was added to hydrogen gas is excited to form a plasma). These drills will be hereinafter referred to as Comparative Examples 1, 2 and 3.

The surface states after pre-processing of the Comparative Examples 1 to 3 were observed by the SEM observation and EPMA analysis. As a result, in Comparative Example 1, Co on the surface layer was removed but the growth of WC particles was not observed. In Comparative Example 2, conversely, it was observed that WC particles were somewhat grown to approximately 0.6 μm but Co on the surface layer was not completely removed and partly exposed to the surface. Further, in Comparative Example 3, the removal of Co on the surface layer was observed but the WC particles on the surface were decarburized in W or $W_2C$, and the growth of WC particles was not observed.

The drilling test for a printed wiring board was conducted by using the aforementioned four kinds of miniature drills. A glass epoxy resin was used as a material to be tested. The number of revolutions of the drills was set to 70000 rpm. As a result, in the miniature drill of Example 1 of the present invention, no peeling of the coated layer was observed after boring of about 200000 holes, and the occurrence of epoxy smear was extremely suppressed. On the other hand, the coated layers on the cutting edges of drills were peeled at the time of boring of about 55000 holes in Comparative Example 1, at the time of boring of about 20000 holes in Comparative Example 2, at the time of boring of about 8000 holes in Comparative Example 3, respectively.

Embodiment 2

A miniature drill having the same material and shape as those of Embodiment 1 was used. This drill was processed for 5 min in a hydrogen plasma in which hydrogen gas is excited by microwaves so that the surface temperature is 1300° C. Thereafter, methane gas of 0.5 volume % was intermittently added to hydrogen gas to provide a hydrogen/carbon mixed gas plasma. The drill was further processed for 20 min. According to the SEM observation and EPMA analysis of the drill after processing, it was assured that Co on the surface layer of the drill was completely removed and the average particle diameter of WC of the surface layer was grown to approximately 1.5 µm.

Next, a hard carbon layer was deposited on the cutting edges of tool under a methane-hydrogen mixed gas excited using a microwave plasma CVD method. At this time, various hard carbon layers were deposited at a variety of methane concentrations from 1% to 5%, gas pressures from 8 Torr to 45 Torr, microwave power levels from 1.5 KW to 3.5 KW, and substrate temperatures from 705° C. to 850° C., respectively. Arrangement of the drill in a reaction chamber was further changed to coat various qualities of carbon layers. The reaction time was 10 to 20 hours. For the purpose of measurement of layer hardness, a substrate comprised of the same material and having the surface polished to a mirror face was also arranged within the reaction chamber of the apparatus.

As the result of the SEM observation and Raman analysis of the surface or cross section of the coated layer after processing under the various conditions, it has been confirmed that the carbon layer of the same quality was coated in about 15 µm on at least the cutting edges the miniature drill and the substrate for measuring hardness.

These samples were studied in detail and analyzed from a viewpoint of the average particle diameter in the surface and the micro Vickers hardness (Hv) of the layer and the Raman intensity ratio ($I_1/I_2$). As the result, the results given in the following Table 1 were obtained. For the micro Vickers hardness (Hv), a hardness measuring substrate was used. The measuring conditions were that the load was 500 g, and the holding time under load was 20 sec. The measurement of Raman spectra was conducted using Ar laser (wave length of 4880 Å, the wave number of 20492.4 $cm^{-1}$), the wave number from 900 $cm^{-1}$ to 1800 $cm^{-1}$, and the scan speed 2 $cm^{-1}$/sec. The samples are referred to as Examples 2 to 9 of the present invention as given in Table 1.

TABLE 1

| No. | Average Particle Diameter | Film Hardness (Hv) | Raman Peak Intensity Ratio ($I_1/I_2$) | Remarks |
| --- | --- | --- | --- | --- |
| 1 | less than 1.0 µm | 5990 | 0.48 | Example 2 of this invention |
| 2 | same as above | 6540 | 0.54 | Example 3 of this invention |
| 3 | same as above | 7720 | 1.98 | Example 4 of this invention |
| 4 | same as above | 8230 | 2.13 | Example 5 of this invention |
| 5 | more than 1.0 µm but less than 5 µm | 5960 | 0.51 | Example 6 of this invention |
| 6 | same as above | 8470 | 2.30 | Example 7 of this invention |
| 7 | more than 5 µm | 7230 | 0.97 | Example 8 of this invention |
| 8 | same as above | 9320 | 3.22 | Example 9 of this invention |

The drilling test for a printed wiring board was conducted using the hard carbon layer coated miniature drill. The cutting conditions were: for 3 sheets stacked of glass epoxy resin board having a thickness of 1.6 mm, Number of revolutions; 60000 rpm. The results are given in the following Table 2.

TABLE 2

| No. | Wear width of cutting edge (after 20000 holes) | State of drilling holes (after 20000 holes). | Number of drilled holes until which film peels and cracks occur. | Remarks |
| --- | --- | --- | --- | --- |
| 1 | approx. 32 µm | Good surface roughness. No epoxy-smear and burr. | more than 150,000 holes. | Example 2 of this invention |
| 2 | approx. 16 µm | Good surface roughness. No epoxy-smear and burr. | more than 200,000 holes. | Example 3 of this invention |
| 3 | approx. 9 µm | Good surface roughness. No epoxy-smear and burr. | more than 200,000 holes. | Example 4 of this invention |
| 4 | approx. 10 µm | Good surface roughness. Some burr occur. | more than 100,000 holes. | Example 5 of this invention |
| 5 | approx. 39 µm | Good surface roughness. No epoxy-smear and burr. | more than 150,000 holes. | Example 6 of this invention |
| 6 | approx. 12 µm | Good surface roughness. Some burr occur. | more than 100,000 holes. | Example 7 of this invention |
| 7 | approx. 20 µm | Good surface roughness. Some burr occur. | more than 150,000 holes. | Example 8 of this invention |
| 8 | approx. 10 µm | Rough surface. Burr occurs. | more than 100,000 holes. | Example 9 of this invention |

As will be apparent from the above results, in the case of drills (Examples 2 to 7 of the present invention) coated with the hard carbon layer in which the average particle diameter in the surface of the layer is 5 µm or less and the micro Vickers hardness (Hv) is 4000 to 9000 and Raman peak intensity ratios are 0.5–2, it is obvious that there exhibits an extremely excellent performance in the wear resistance and peeling resistance of the layer and the cutting accuracy of work material to be cut. Further, as shown in Examples 3 and 4 of the present invention, in the case where the average particle diameter is 1 mm or less, the micro Vickers hardness (Hv) of the layer is 6000 to 8000, and the value of the Raman peak strength is within the above-described range, the effect of the present invention is exhibited particularly conspicuously.

Embodiment 3

The substrates used are miniature drills (diameter: 0.5 mm) made of WC—Co alloy of type M (Co: about 10%, and average particle diameter of WC: about 0.25 µm). The drills were arranged within the plasma producing system so that only the extreme top of drills was processed, and these were exposed to the hydrogen plasma in which hydrogen gas was excited by the microwave for 10 min. At this time, the surface temperature of the extreme top of drill was set to approximately 1300° C. Then, methane gas of about 0.5 volume % was introduced into hydrogen gas to form a hydrogen/carbon mixed plasma. The drills were exposed for 5 min, and after that, the introduction of methane gas is stopped so that only the hydrogen plasma remains. The drills were exposed for 20 min. According to SEM and EPMA observations for cutting edges of the drills after processing, it has been confirmed that only the surface around the region within about 5 mm from the extreme top of drill was modified, Co on the surface of treated drill was completely removed, and the average particle diameter of the WC of the surface was grown to about 1 µm. Further, according to AES analysis of the modified surface of the WC particles, the state of C of the surface is the state of a carbide with W, and their constituent ratio therebetween was analyzed substantially to be 1:1.

Next, at least the cutting edge of the drill after processing was dipped into an ethanol suspension in which diamond powder (an average particle diameter: approximately 0.3 µm) are dispersed and subjected to supersonic processing. Then, drills were subjected to vapor phase deposition for 7 hours with a methane/hydrogen mixed gas (methane: about 1.5 volume %) excited by a microwave plasma CVD method, and a hard carbon layer was coated in thickness of approximately 7.5 µm on the cutting edge portion. The thus obtained hard carbon layer coated on WC—Co alloy drill will be hereinafter referred to as Example 10 of the present invention.

As the plasma exposure pre-processing which is the preceding step for coating the hard carbon layer, there were prepared a drill which is exactly the same as that of Example 9 of the present invention except that the methane gas is not introduced, and it is exposed for 30 min only in the hydrogen plasma, and a drill which was exposed to the hydrogen plasma for 10 min, and after that, methane gas of about 0.5 volume % was continuously introduced into the hydrogen gas for 20 min. These drills are referred to as Examples 11 and 12, respectively, of the present invention. According to the SEM and PMA observations of the extreme top of the drills after processing, in both Examples 11 and 12 of the present invention, only the surface around the region within about 5 mm from the extreme top was modified, Co of the surface of the drill was completely removed and the average particle diameter of WC of the surface layer was grown to about 1 to 1.5 µm. In case of Example 11 of the present invention out of these, it was observed that a η phase was partly produced along the ridge line of cutting edge. Further, in case of Example 12 of the present invention, it was confirmed by the AES analysis of the modified surface of WC particles that the surplus C considered to be derived from free carbon or tungsten carbide ($WC_{1+2}$) of the nonstoichiometry is partly present on the surface.

As a result of the detailed comparison with respect to the surface states after the hard carbon layer was coated, it was observed that in case of Examples 11 and 12 of the present invention, the unique growth of particles and formation of ball-like particles in the hard carbon layer were observed somewhat more than that of the Example 10 of the present invention.

Further, the drilling test for a printed wiring board was conducted using these three kinds of drills. The cutting conditions were: for 2 sheets stacked of glass epoxy resin board, Number of revolutions; 75000 rpm, feed speed; 2 m/min. As the result, for these three drills, no damage such as peeling of the coated layer was observed for the number of 10000 hits. However, in Examples 11 and 12 of the present invention, peeling of the coated layer was confirmed at about 15000 hits and about 18000 hits, respectively. It was presumed that the peeling of the layer resulted from the fact that the adhesive strength with the hard carbon layer is somewhat lowered by the η phase present on the surface of the drill before coating and the surplus C. In Example 10 of the present invention, no peeling of the coated layer occurs after 30000 hits. The result of the through-hole evaluation after drilling was also good.

What is claimed is:

1. A WC—Co alloy comprising WC as a main component, wherein substantially only WC particles and, optionally, components other than binder metals belonging to the iron group are exposed at the surface of said alloy, and wherein
    (a) an average particle diameter of the WC particles at the surface of the alloy is larger than the average particle diameter of WC particles of the interior of said alloy, and/or
    (b) the hardness of the alloy surface is higher than the hardness of the alloy interior.

2. The WC—Co alloy according to claim 1, wherein the average particle diameter of the WC particles at the surface of the alloy is 0.5 µm or more.

3. The WC—Co alloy according to claim 1 or 2, wherein a micro Vickers hardness (Hv) of the surface is 1650 or more.

4. The WC—Co alloy of claim 1 further comprising a hard carbon layer coated on the surface of said alloy by vapor phase deposition.

5. The WC—Co alloy according to claim 4, wherein the micro Vickers hardness (Hv) of said hard carbon-layer is 4000 to 9000, and the average particle diameter in the surface of said hard carbon-layer is 5 µm or less.

6. The WC—Co alloy according to claim 5, wherein in the Raman spectra of said hard carbon-layer, a ratio ($I_1/I_2$) between a peak intensity ($I_1$) belonging to diamond and a peak intensity ($I_2$) of a nondiamond component which appears at 1450 to 1600 $cm^{-1}$ is 0.5 to 2.

7. A WC—Co alloy tool comprising the WC—Co alloy described in any of claims 1 or 2 as cutting edges of the tool.

8. A WC—Co alloy tool in which the coated WC—Co alloy described in any of claims 4 to 6 is present as cutting edges of the tool.

9. The alloy of claim 1, wherein an average particle diameter of the WC particles at the surface of the alloy is larger than the average particle diameter of WC particles of the interior of the alloy.

10. The alloy of claim 1, wherein the hardness of the alloy surface is higher than the hardness of the alloy interior.

11. The alloy of claim 1, wherein an average particle diameter of the WC particles at the surface of the alloy is larger than the average particle diameter of the WC particles of the interior of the alloy, and the hardness of the alloy surface is higher than the hardness of the alloy interior.

12. A method for the preparation of a WC—Co alloy according to claim 1 comprising exposing the surface of a WC—Co alloy to a plasma comprising H and not comprising C to produce an initial WC—Co alloy, and after that, introducing a material containing C into a plasma producing system to excite it, and exposing the surface of the initial WC—Co alloy to plasma in the plasma producing system.

13. The method according to claim 12, wherein after the surface of the initial WC—Co alloy is exposed in the plasma producing system the introduction of the material containing C into the plasma producing system is stopped, and the surface of the WC—Co alloy is further exposed in a plasma substantially not containing C.

14. The method of claim 12, further comprising depositing a hard carbon layer on the alloy surface after the initial WC—Co alloy is exposed to plasma in the producing system.

15. The method of claim 13, further comprising depositing a hard carbon layer on the alloy surface after the alloy has been exposed in a plasma substantially not containing C.

16. A WC—Co alloy produced by the method of claim 12.

17. A WC—Co alloy produced by the method of claim 13.

18. A WC—Co alloy produced by the method of claim 14.

* * * * *